United States Patent
Furukawa et al.

(10) Patent No.: US 8,963,194 B2
(45) Date of Patent: *Feb. 24, 2015

(54) LIGHT EMITTING DEVICE

(71) Applicant: Kabushiki Kaisha Toshiba, Minato-ku, Tokyo (JP)

(72) Inventors: Chisato Furukawa, Fukuoka-ken (JP); Takafumi Nakamura, Fukuoka-ken (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/914,749

(22) Filed: Jun. 11, 2013

(65) Prior Publication Data

US 2013/0270604 A1    Oct. 17, 2013

Related U.S. Application Data

(62) Division of application No. 12/364,567, filed on Feb. 3, 2009, now Pat. No. 8,482,024.

(30) Foreign Application Priority Data

May 27, 2008    (JP) .................................. 2008-137945

(51) Int. Cl.
    *H01L 33/00*    (2010.01)
    *H01L 33/14*    (2010.01)
    (Continued)

(52) U.S. Cl.
    CPC ................ *H01L 33/14* (2013.01); *H01L 33/38* (2013.01); *H01L 33/20* (2013.01); *H01L 2933/0016* (2013.01)
    USPC ..................................... 257/99; 257/E33.062

(58) Field of Classification Search
    CPC ...................................................... H01L 33/14
    USPC ............................................. 257/99, E33.062
    See application file for complete search history.

(56) References Cited

U.S. PATENT DOCUMENTS 5,917,202 A    6/1999    Haitz et al.
6,518,601 B2    2/2003    Wirth
(Continued)

FOREIGN PATENT DOCUMENTS

JP    2002-164574    6/2002
JP    2003-258296    9/2003
(Continued)

OTHER PUBLICATIONS

Japanese Office Action issued in counterpart JP Application No. 2012-263647 on Aug. 26, 2013, along with English translation thereof.

(Continued)

*Primary Examiner* — Matthew Reames
(74) *Attorney, Agent, or Firm* — White & Case LLP

(57) ABSTRACT

A light emitting device includes a light emitting layer having a first side and a second side opposite to the first side; an upper electrode; a current diffusion layer provided between the light emitting layer and the upper electrode and including a first layer on the first side of the light emitting layer and a second layer on a side of the upper electrode, the second layer having a carrier concentration higher than a concentration of the first layer, a recess being formed in a non-forming region of the upper electrode of the current diffusion layer so that a width of the recess decreases toward the light emitting layer, a sidewall of the second layer being at least a part of a sidewall of the recess; and a reflecting layer provided on the second side of the light emitting layer, the upper electrode being provided on the second layer, and the light emitting layer and the current diffusion layer being made of a III-V group compound semiconductor, respectively.

4 Claims, 5 Drawing Sheets

(51) Int. Cl.
*H01L 33/38* (2010.01)
*H01L 33/20* (2010.01)

(56) References Cited

U.S. PATENT DOCUMENTS

| | | | |
|---|---|---|---|
| 6,987,613 B2 | 1/2006 | Pocius et al. | |
| 7,038,245 B2 | 5/2006 | Nitta et al. | |
| 8,482,024 B2 * | 7/2013 | Furukawa et al. | 257/99 |
| 2004/0008747 A1 | 1/2004 | Nakayama et al. | |
| 2006/0056474 A1 | 3/2006 | Fujimoto et al. | |
| 2006/0076565 A1 | 4/2006 | Murofushi et al. | |
| 2006/0202216 A1 | 9/2006 | Itonaga | |
| 2007/0096110 A1 | 5/2007 | Kato et al. | |
| 2008/0149916 A1 | 6/2008 | Baba et al. | |

FOREIGN PATENT DOCUMENTS

| | | |
|---|---|---|
| JP | 2005-223100 | 8/2005 |
| JP | 2006-041479 | 2/2006 |
| JP | 2006-310721 | 11/2006 |
| JP | 2007-123517 | 5/2007 |
| JP | 2008-066554 | 3/2008 |
| JP | 2008-084973 | 4/2008 |
| TW | 200644265 | 12/2006 |

OTHER PUBLICATIONS

Japanese Office Action for Japanese Application No. 2008-137945 mailed on Nov. 7, 2011.

Japanese Office Action for Japanese Application No. 2008-137945 mailed on Feb. 22, 2012.

Taiwanese Office Action for Taiwanese Application No. 098115549 mailed on Jul. 10, 2012.

U.S. Office Action for U.S. Appl. No. 12/364,567 mailed on Sep. 16, 2010.

U.S. Office Action for U.S. Appl. No. 12/364,567 mailed on Mar. 3, 2011.

\* cited by examiner

LIGHT EMITTING DEVICE

CROSS-REFERENCE TO RELATED APPLICATIONS

This application is a Division of application Ser. No. 12/364,567 filed Feb. 3, 2009; the entire contents of which are incorporated herein by reference.

This application is based upon and claims the benefit of priority from the prior Japanese Patent Application No. 2008-137945, filed on May 27, 2008; the entire contents of which are incorporated herein by reference.

BACKGROUND OF THE INVENTION

1. Field of the Invention

This invention relates to a light emitting device and a method for manufacturing the same.

2. Background Art

A light emitting device with high brightness is required, for example, in illumination devices, LED displays, and backlight sources for image displays capable of emitting light in visible to infrared wavelength ranges.

The light in visible to infrared wavelength ranges emitted from an InAlGaP-based light emitting layer is absorbed in GaAs of the substrate, and the brightness decreases. Hence, a crystal growth layer including a light emitting layer that is easily lattice matched with GaAs, and a GaP substrate that is lattice mismatched with GaAs but translucent, are laminated illustratively using a wafer bonding process to provide a structure achieving high brightness.

Furthermore, high brightness requires a chip structure for increasing the external light extraction efficiency and internal efficiency. Among them, the light extraction efficiency is increased by using a structure in which an ITO (indium tin oxide) or other transparent electrode is provided on the chip surface. However, the ITO or other transparent electrode has the problems of low light transmittance and having difficulty in achieving good ohmic contact.

JP-A-2002-164574 (Kokai) discloses a technique related to a high-power light emitting device with enhanced external quantum efficiency. In this technique, a light extraction window is etched, which is shaped like an elongated rectangle as viewed from the upper surface of the device. The end surface of the light emitting section is exposed to the recessed sidewall formed by etching and improves the external light extraction efficiency.

However, in this technique, the recess needs to be etched more deeply than the light emitting layer, thus complicating the manufacturing process. Furthermore, exposure of the end surface and its neighborhood of the light emitting section is likely to cause such problems as the crystal surface being prone to degradation.

SUMMARY OF THE INVENTION

According to an aspect of the invention, there is provided a light emitting device including: a light emitting layer made of semiconductor; an upper electrode including a bonding electrode capable of connecting a wire thereto and a thin-wire electrode surrounding the bonding electrode with a spacing and including a junction with the bonding electrode; and a current diffusion layer provided between the light emitting layer and the upper electrode and made of semiconductor, the current diffusion layer including a recess that is formed in a non-forming region of the upper electrode and capable of emitting light emitted from the light emitting layer.

According to another aspect of the invention, there is provided a light emitting device including: a laminated body including a light emitting layer and a current diffusion layer and made of semiconductor; a substrate capable of transmitting emitted light from the light emitting layer, the laminated body being provided on one major surface of the substrate; an upper electrode provided on the laminated body, the upper electrode including a bonding electrode capable of connecting a wire thereto and a thin-wire electrode surrounding the bonding electrode with a spacing and including a junction with the bonding electrode; a lower electrode provided on the other major surface of the substrate; and a reflecting layer provided on the other major surface, the current diffusion layer being provided between the light emitting layer and the upper electrode and including a recess that is formed in a non-forming region of the upper electrode and capable of emitting the emitted light.

According to another aspect of the invention, there is provided a method for manufacturing a light emitting device, including: forming an upper electrode above a current diffusion layer provided above a light emitting layer, the upper electrode including a bonding electrode and a thin-wire electrode surrounding the bonding electrode with a spacing and including a junction with the bonding electrode; and forming a recess by etching a surface of the current diffusion layer, the surface being a non-forming region of the upper electrode.

DETAILED DESCRIPTION OF THE INVENTION

Embodiments of the invention will now be described with reference to the drawings.

Figure 1A:
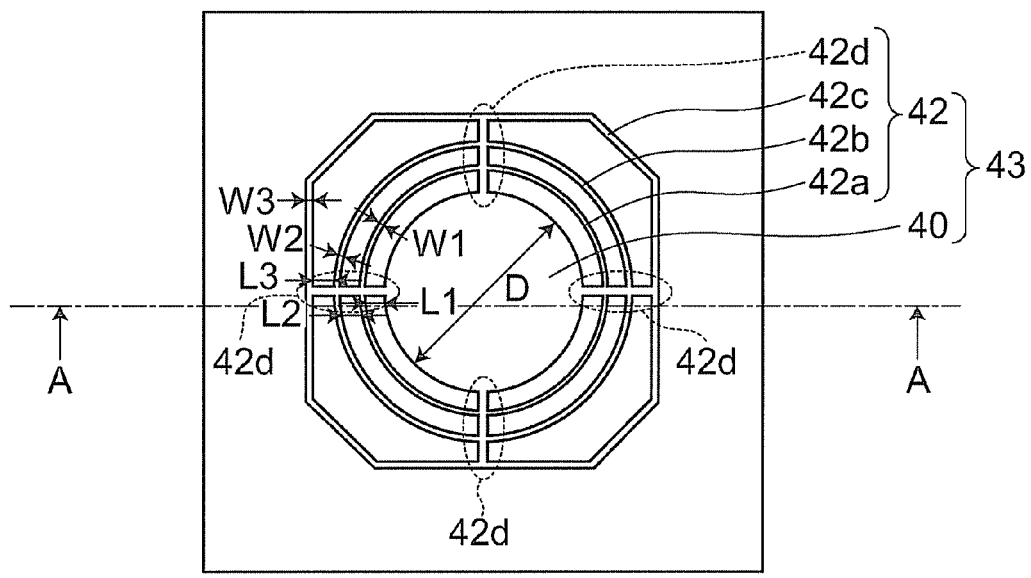
FIGS. 1A and 1B are schematic views of a light emitting device according to a first embodiment.
Figure 1B:
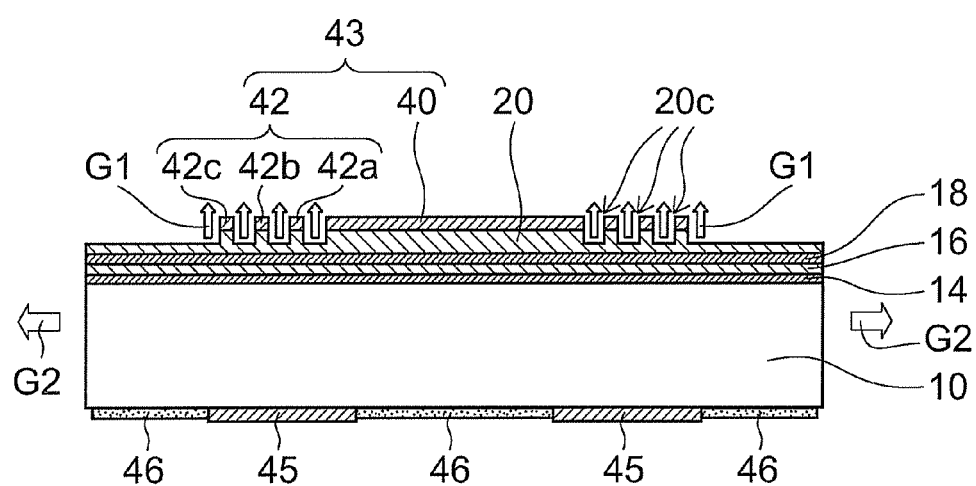

FIG. 1 is a schematic view of a light emitting device according to a first embodiment of the invention, in which FIG. 1A is a plan view, and FIG. 1B is a cross-sectional view taken along line A-A.

On a translucent substrate 10 illustratively made of GaP is provided a semiconductor laminated body illustratively made of a first cladding layer 14, a light emitting layer 16, a second cladding layer 18, and a current diffusion layer 20.

On the current diffusion layer 20 is provided an upper electrode 43 made of a bonding electrode 40 and a thin-wire electrode 42. In this figure, the thin-wire electrode 42 includes a first thin-wire electrode 42a spaced by distance L1 from the bonding electrode 40 and having width W1, a second thin-wire electrode 42b spaced by distance L2 from the first thin-wire electrode 42a and having width W2, a third thin-wire electrode 42c spaced by distance L3 from the second thin-wire electrode 42b and having width W3, and a junction 42d with the bonding electrode 40. The bonding electrode 40 is planarly connected to the three thin-wire electrodes 42a, 42b, and 42c through the junction 42d. In consideration of wire crushing and the like in bonding, the diameter D of the bonding electrode 40 can be illustratively about 100 μm.

By a voltage applied to the upper electrode 43, carriers are injected into the light emitting layer 16 through the current diffusion layer 20. The current diffusion layer 20 spreads the current in the lateral direction along the crystal growth plane of the light emitting layer 16 to expand the light emitting region. However, with the lateral distance from directly below the upper electrode 43, the current flows less easily. Thus, the thin-wire electrode 42 is placed with certain spacings L1, L2, L3 around the bonding electrode 40 so that carriers are easily spread in a wider lateral region of the light emitting layer 16 to increase optical output.

Here, the bonding electrode 40 and the thin-wire electrode 42 block the light emitted upward from the light emitting layer 16. Hence, the widths W1, W2, W3 and the distances L1, L2, L3 of the thin-wire electrode 42 are suitably determined so that the emitted light G1 can be emitted upward while the current is laterally diffused.

On the other hand, the light directed from the light emitting layer 16 to the GaP substrate 10 is turned into laterally emitted light G2 by being transmitted through the translucent GaP substrate 10 and reflected at a lower electrode 45 and a reflecting layer 46, or by direct propagation.

In GaP and InGaAlP-based materials, higher carrier concentration results in decreased crystallinity and the like, and increases optical absorption. In this embodiment, a region of the current diffusion layer 20, which is the non-forming region of the upper electrode 43 with low current density, is partly removed to form a recess 20c, thereby reducing the optical absorption and increasing the brightness. The recess 20c does not penetrate through the current diffusion layer 20. That is, the depth of the recess 20c is smaller than the thickness of the current diffusion layer 20. Furthermore, because the thin-wire electrode 42 does not need wire bonding, its widths W1, W2, W3 are narrowed to increase the light extraction efficiency as long as the current can be laterally diffused. It is noted that the structure and function of the current diffusion layer 20 are described later.

Figure 2:
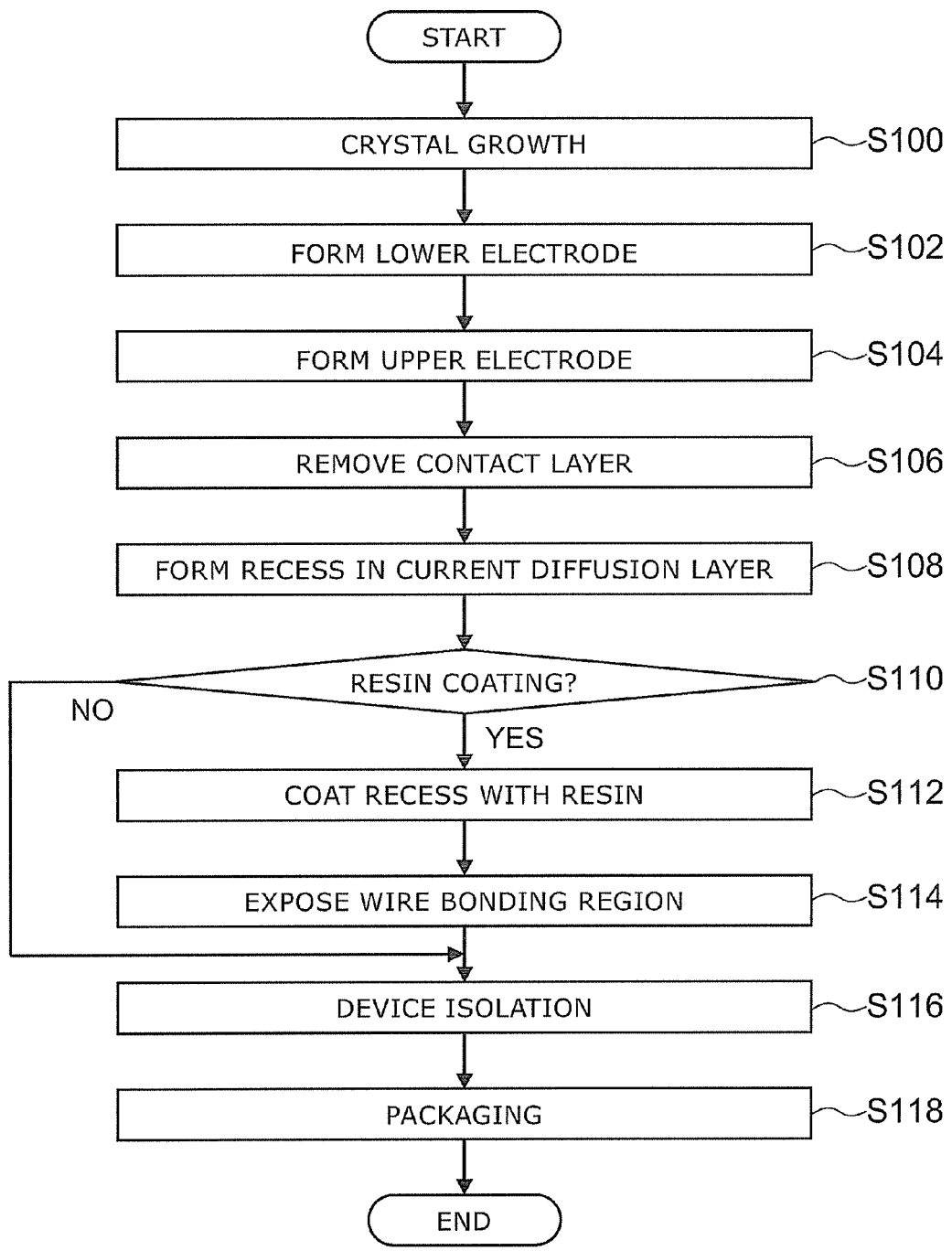
FIG. 2 is a flow chart illustrating a method for manufacturing the light emitting device according to this embodiment.

FIG. 2 is a flow chart illustrating a method for manufacturing a light emitting device according to this embodiment.

Figure 3:
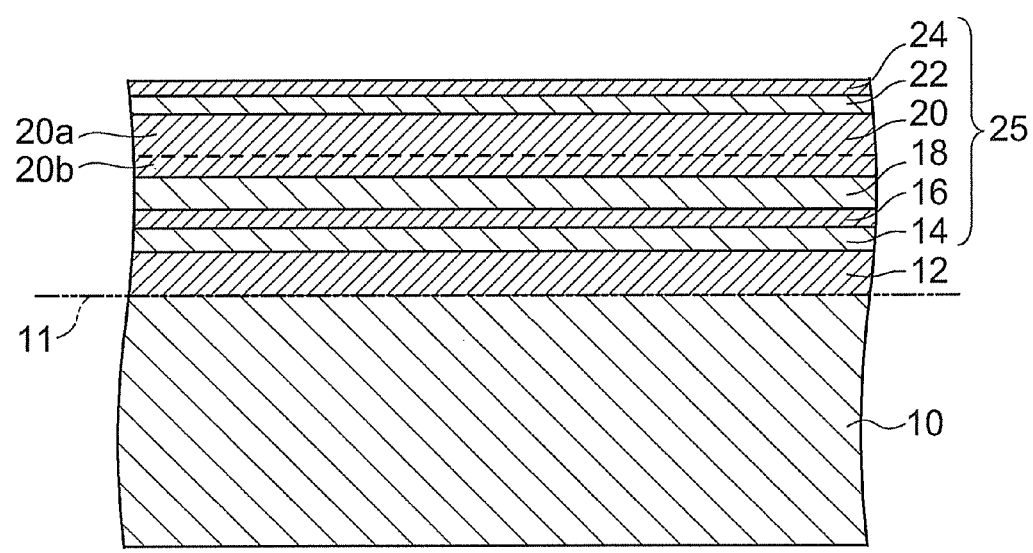
FIG. 3 is a schematic cross-sectional view of an epitaxial wafer.

FIG. 3 is a schematic cross-sectional view of an epitaxial wafer.

A bonding layer 12 (thickness 0.4 μm, carrier concentration $4 \times 10^{17}$ cm$^{-3}$) illustratively including n-type InGaAlP is bonded to a translucent n-type GaP substrate 10 at an interface 11, and an upper growth layer 25 is laminated on the bonding layer 12.

In the upper growth layer 25, a cladding layer 14 (thickness 0.6 μm, carrier concentration $4 \times 10^{17}$ cm$^{-3}$) made of n-type InAlP, a light emitting layer 16 made of $In_{0.5}(Ga_xAl_{1-x})_{0.5}P$ ($0 \leq x \leq 1$), a cladding layer 18 (thickness 0.6 μm, carrier concentration $4 \times 10^{17}$ cm$^{-3}$) made of p-type InAlP, a current diffusion layer 20 (thickness 1.5 μm, carrier concentration $1.5 \times 10^{18}$ cm$^{-3}$) made of p-type $In_y(Ga_{0.3}Al_{0.7})_{1-y}P$ ($0 \leq y \leq 1$), an intermediate layer 22 (thickness 0.1 μm, carrier concentration $3 \times 10^{18}$ cm$^{-3}$) made of p-type InGaAlP, and a contact layer 24 made of p-type GaAs are laminated in this order (S100). It is noted that the current diffusion layer 20 can also be made of two layers, such as a first layer 20b (thickness 0.2 μm, carrier concentration $4 \times 10^{17}$ cm$^{-3}$) and a second layer 20a (thickness 1.3 μm, carrier concentration $1.5 \times 10^{18}$ cm$^{-3}$).

Use of a multiple quantum well structure in the light emitting layer 16 facilitates reducing the operating current and controlling the emission wavelength in visible to infrared wavelength ranges. This upper growth layer 25 can be crystal grown using such methods as MOCVD (metal organic chemical vapor deposition) and MBE (molecular beam epitaxy).

On the mounting surface side of the GaP substrate 10, a lower electrode 45 and a reflecting layer 46 illustratively made of AuGe are formed by such methods as sputtering or evaporation (S102). Here, the coverage ratio of the lower electrode 45 is illustratively 30%, and the reflecting layer 46 is illustratively formed from a dielectric multilayer film or metal. Then, optical absorption at the lower surface is easily reduced to increase the brightness.

Furthermore, on the upper growth layer 25, an upper electrode 43 illustratively made of AuZn is formed illustratively by the lift-off method (S104). In a later process for forming a recess 20c in the surface of the current diffusion layer 20, if the directly underlying portion of the thin-wire electrode 42 is overetched, carrier injection into the light emitting layer 16 is likely to be insufficient as a result of, for example, high series resistance between the thin-wire electrode 42 and the light emitting layer 16, or the disappearance of the thin-wire electrode 42. If the widths W1, W2, and W3 of the thin-wire electrode 42 are 3 μm or more, and more preferably 5 μm or more, then carriers can be reliably injected into the light emitting layer 16. It is noted that in the case where the GaP substrate 10 is of n-type, the upper electrode 43 is a p-type electrode, and the lower electrode 45 is an n-type electrode.

Subsequently, in the contact layer 24 and the intermediate layer 22 provided between the upper electrode 43 and the current diffusion layer 20, the non-forming region of the upper electrode 43 is etched away (S106). GaAs constituting the contact layer 24 is preferably removed because it absorbs visible light and decreases optical output.

Then, by the sintering process and the like, ohmic contact is made between the contact layer 24 and the upper electrode 43 and between the GaP substrate 10 and the lower electrode 45. Subsequently, in the current diffusion layer 20, the non-forming region of the upper electrode 43 is partly etched to form a recess 20c. Here, using an etching solution such as those based on hydrochloric acid, phosphoric acid, and sulfuric acid, the upper electrode 43 is used as a mask to form a recess 20c in the region where the current is diffused less easily (S108). It is noted that without using the upper electrode 43 as a mask, the recess 20c can also be formed by patterning.

It is determined whether, in the wafer state, the recess 20c is filled with a translucent dielectric such as resin (S110). In the case where it is not filled, the flow proceeds to the device isolation process (S116).

On the other hand, in the case where the recess 20c is filled with resin or the like, the wafer surface is uniformly coated with resin illustratively by spincoating (S112). The resin is cured as needed, and the surface of the bonding electrode 40 is exposed by a dry etching method such as CDE (chemical dry etching) (S114). It is noted that in the case where the dielectric is made of AlN (aluminum nitride) and the like, such methods as sputtering and CVD (chemical vapor deposition) can be used.

Then, device isolation is performed (S116), and a light emitting device is packaged by chip bonding, wire bonding and the like on a mounting member (S118). Here, covering the chip with a sealing resin facilitates protecting the chip and increasing the light extraction efficiency. In the case where the dielectric is not formed in the wafer state, the recess 20c is filled with a sealing resin in the packaging process after the device isolation. Thus, this embodiment provides a manufacturing method suitable for mass production of a light emitting device, which can achieve high brightness with reduced optical absorption and improved light extraction efficiency.

Furthermore, in the manufacturing method according to this embodiment, there is no need to cause the depth of the recess 20c to reach the light emitting layer 16, and the process for forming the recess 20c is simplified. If the light emitting layer 16 is exposed, the process for forming the recess 20c may produce crystal defects inside or on the surface of the light emitting layer 16, which may cause such troubles as brightness decrease or energization degradation. This embodiment, in which the light emitting region of the light emitting layer 16 is not exposed, reduces the occurrence of crystal defects and facilitates ensuring higher reliability.

Next, the structure of the recess 20c and its function are described.

Figure 4A:
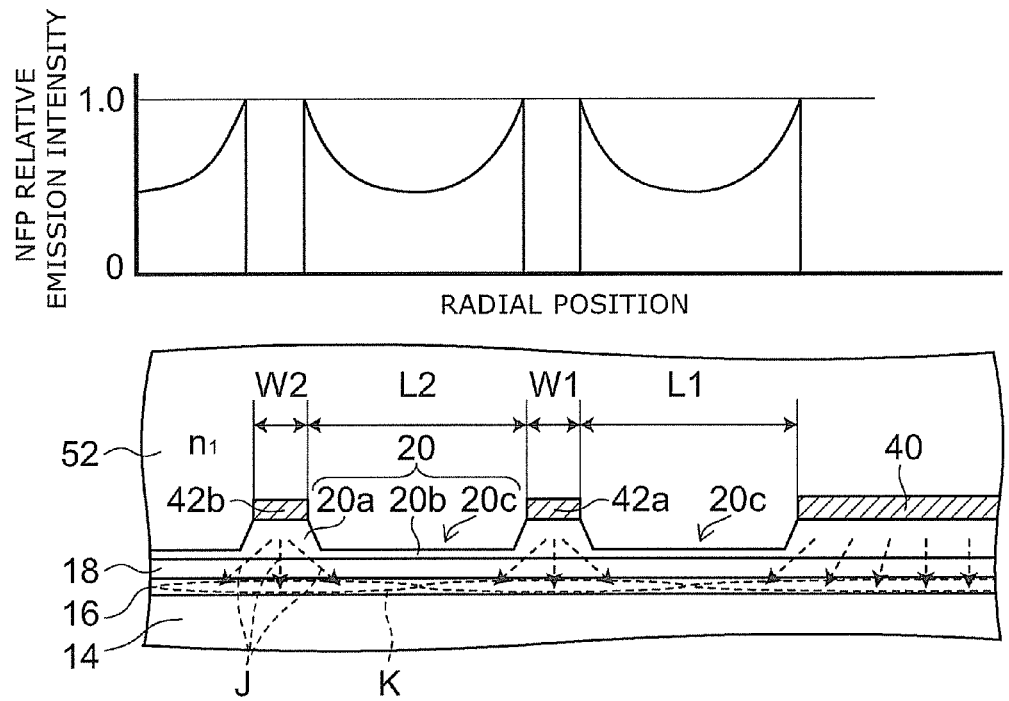
FIGS. 4A and 4B describe NFP.
Figure 4B:
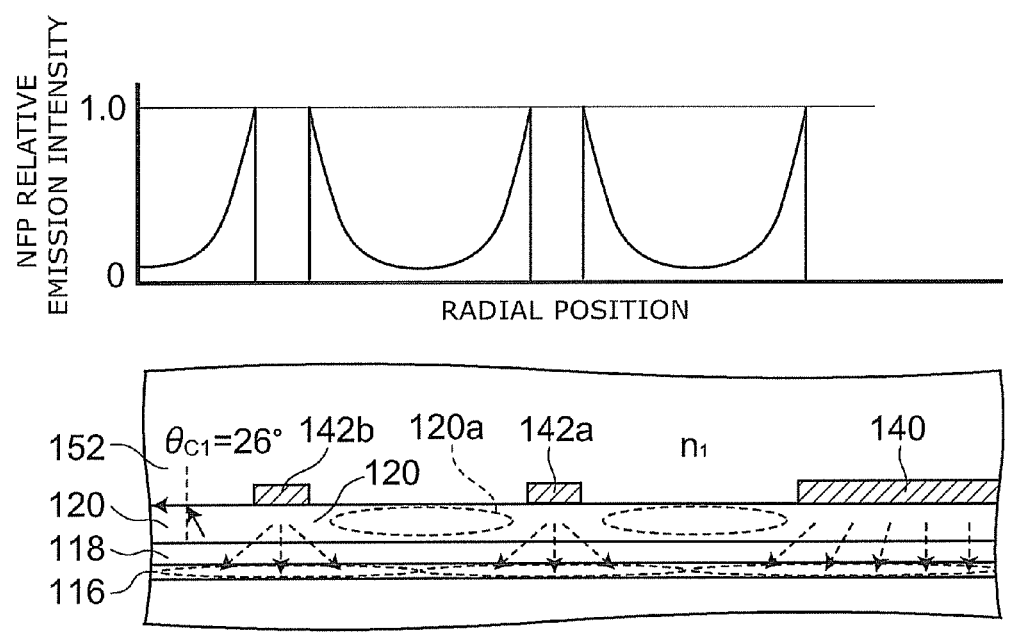

FIG. 4 illustrates the NFP (near field pattern) around the chip surface, in which FIGS. 4A and 4B correspond to the first embodiment and a comparative example, respectively.

In FIG. 4A, the distance L1 between the bonding electrode 40 and the thin-wire electrode 42a, the distance L2 between the thin-wire electrode 42a and the thin-wire electrode 42b, and the distance L3 between the thin-wire electrode 42b and the thin-wire electrode 42c are each generally 20 µm. However, it is understood that the invention is not limited thereto. It is noted that this figure shows the relative emission intensity of the NFP at radial positions along line A-A of FIG. 1A. The current flowing in the vertical direction of the chip from the bonding electrode 40 and the thin-wire electrode 42 is laterally spread by the current diffusion layer 20, and carriers 3 are injected into the light emitting layer 16 along the direction indicated by dashed lines. This allows light to be emitted from the light emitting region K in the light emitting layer 16, which is wider than the directly underlying neighborhood of the upper electrode 43.

For example, in the cross section taken along line A-A of FIG. 1A, by the emitted light transmitted through the etched recess 20c, the relative emission intensity of the NFP is locally maximized near the end portion of the upper electrode 43, and locally minimized around the midpoint between the upper electrodes 43 as viewed from above. In FIG. 4A, the upper surface of the chip is filled with a sealing resin 52 having refractive index $n_1$. The sealing resin 52 is made of a material such as epoxy and silicone, and the refractive index $n_1$ thereof is illustratively in the range of 1.4 to 1.5. At a wavelength of 700 nm, if the refractive index $n_1$ is 1.4 and the refractive index $n_3$ of the current diffusion layer 20 is 3.2, then the critical angle $\theta_{C1}$ is generally 26°. Hence, the light emitted upward from the light emitting region K can be emitted from the sidewall of the recess 20c, and the light extraction efficiency can be increased. If the current diffusion layer is made of ITO (refractive index being generally 2.2), the critical angle with respect to the laminated body made of semiconductor (refractive index being generally 3.2) is generally 43°. The emitted light having a larger incident angle than this is reflected by ITO, and has difficulty in being emitted from the sidewall of the recess 20c. Thus, the light extraction efficiency decreases. That is, the current diffusion layer 20 made of semiconductor increases the extraction efficiency of the light emitted upward from the light emitting region K below the thin-wire electrodes 42a, 42b more easily than the current diffusion layer made of a metal compound including a metal oxide such as ITO and a metal nitride such as titanium nitride.

On the other hand, FIG. 4B shows a light emitting device according to a comparative example. In the comparative example, the current diffusion layer 120 includes no recess, and its upper portion is covered with a sealing resin having a refractive index $n_1$ of 1.4. The current diffusion layer 120 has a carrier concentration of $1.5 \times 10^{18}$ cm$^{-3}$ and a thickness of 1.5 µm. Then, in the region 120a between the bonding electrode 140 and the thin-wire electrode 142a and between the thin-wire electrodes 142a and 142b, the current is not diffused sufficiently. Furthermore, the region 120a has high optical absorption because of, for example, decreased crystallinity due to high concentration. That is, the light extraction efficiency is decreased. Consequently, the relative emission intensity of the NFP may decrease to nearly zero around the center of the region 120a.

In contrast, the relative emission intensity of the NFP of this embodiment shown in FIG. 4A has a smaller amount of decrease even around the midpoint between the upper electrodes 43, and can easily maintain high brightness.

It is noted that in FIG. 4A, the depth of the recess 20c is smaller than the thickness of the current diffusion layer 20. However, the recess 20c may generally penetrate through the current diffusion layer 20 and expose the cladding layer 18. Furthermore, the current diffusion layer 20 can have a structure including a first layer 20b having a carrier concentration of $4 \times 10^{17}$ cm$^{-3}$ and a thickness of 0.2 µm and a second layer 20a provided thereon and having a carrier concentration of $1.5 \times 10^{18}$ cm$^{-3}$ and a thickness of 1.3 µm. In this case, the second layer 20a having large optical absorption is removed. Hence, while maintaining high optical output, the remaining first layer 20b facilitates laterally spreading the current.

It is noted that suitable selection of the etching solution to bevel the sidewall of the recess 20c as in FIG. 4A facilitates diffusing the current and further increasing the upward light extraction efficiency around the sidewall.

Figure 5:
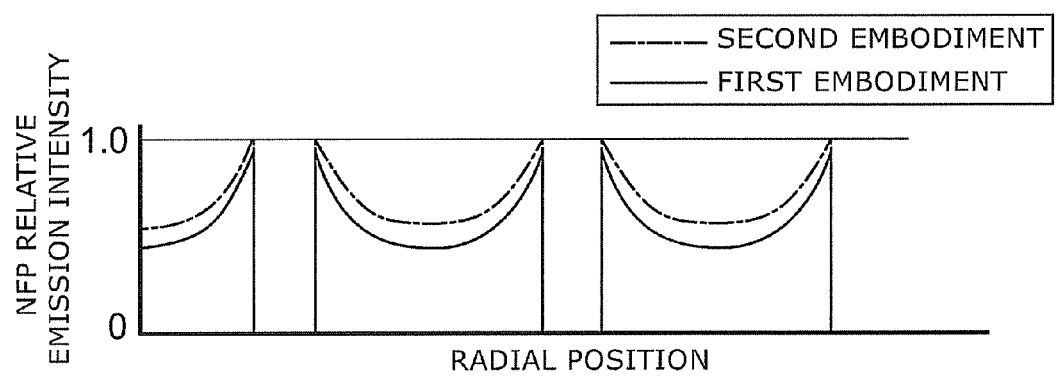
FIG. 5 shows a light emitting device according to a second embodiment.
Figure 5:
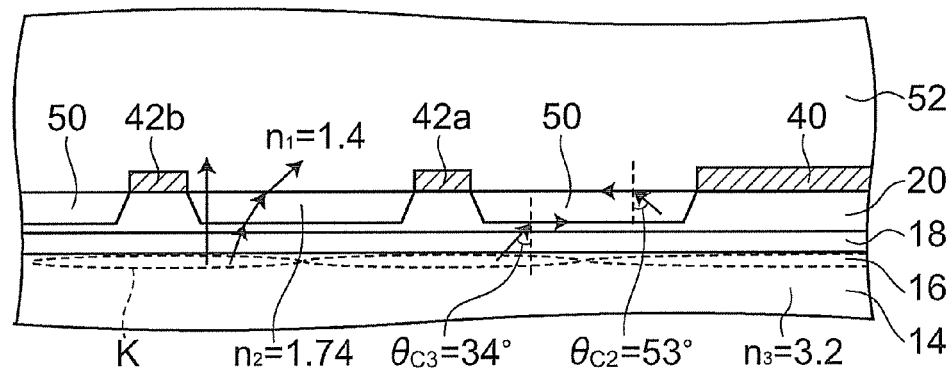

FIG. 5 shows a light emitting device according to a second embodiment.

In this embodiment, the recess 20c is filled with a translucent dielectric 50 having refractive index $n_2$ between the refractive index $n_3$ of the current diffusion layer 20 and the refractive index $n_1$ of the sealing resin 52 (where $n_3 > n_2 n_1$).

For example, if the refractive index $n_3$ of the current diffusion layer 20 is 3.2 and the refractive index $n_1$ of the sealing resin 52 covering the surface of the light emitting chip is 1.4, then the critical angle $\theta_{C1}$ for the direct emission from the chip inside to the sealing resin 52 is generally 26°. Furthermore, if the refractive index $n_2$ of the translucent dielectric 50 is 1.74, the critical angle $\theta_{C3}$ at the interface between the current diffusion layer 20 and the translucent dielectric 50 is generally 34°, and the critical angle $\theta_{C2}$ at the interface between the translucent dielectric 50 and the sealing resin 52 is generally 53°.

On the other hand, in the comparative example of FIG. 4B, the critical angle $\theta_{C1}$ is generally 26°. Hence, the emitted light that can be extracted has a narrow angular range, and the proportion of total reflection at the interface between the current diffusion layer 120 and the sealing resin increases. The light reflected at the interface repeats multiple reflection inside the chip and ends up with thermal loss, hence decreasing the light extraction efficiency.

In contrast, in this embodiment, the emitted light is extracted outside through the translucent dielectric 50 having an intermediate refractive index between those of the current diffusion layer 20 and the sealing resin 52. Thus, total reflection at each interface is reduced to increase the light extraction efficiency, and the relative emission intensity of the NFP, indicated by the dot-dashed line, can be made higher than the relative emission intensity of the first embodiment, indicated by the solid line. Hence, high brightness can be achieved more easily.

It is noted that the translucent dielectric 50 can be illustratively made of thiourethane resin. Its refractive index is illustratively 1.7 to 1.74. It is noted that the refractive index can be increased by dispersing fine particles illustratively made of a translucent metal oxide in the translucent resin, and higher brightness can be easily achieved.

The second embodiment also includes the case where the translucent dielectric 50 is illustratively made of polyimide resin and its refractive index $n_2$ is close to the refractive index $n_1$ of the sealing resin 52. Furthermore, the translucent dielectric 50 and the sealing resin 52 may be made of the same material. For example, the sealing resin 52 may be filled in the recess 20c.

The above embodiments assume that the conductivity type of the GaP substrate 10 and the current diffusion layer 20 is n-type and p-type, respectively. However, the invention is not limited thereto, but the conductivity type of the GaP substrate 10 and the current diffusion layer may be p-type and n-type, respectively.

The InGaAlP-based material referred to herein is a material represented by the composition formula $In_x(Ga_yAl_{1-y})_{1-x}P$ (where $0 \leq x \leq 1$, $0 \leq y \leq 1$), also including those doped with p-type or n-type impurity.

However, the invention is not limited thereto. For example, the material also includes a material represented by the composition formula $In_z(Ga_wAl_{1-w})_{1-z}N$ (where $0 \leq z \leq 1$, $0 \leq w \leq 1$) doped with p-type or n-type impurity. In this case, by dispersing phosphors in the resin, the mixed light of the wavelength-converted light from the phosphors and the emitted light from the light emitting layer 16 can be obtained with high brightness.

The embodiments of the invention have been described with reference to the drawings. However, the invention is not limited to these embodiments. Those skilled in the art can modify the material, size, shape, layout and the like of the substrate, light emitting layer, current diffusion layer, recess, bonding electrode, thin-wire electrode, lower electrode, sealing resin, translucent dielectric and the like constituting the embodiments, and such modifications are also encompassed within the scope of the invention as long as they do not depart from the spirit of the invention.

The invention claimed is:

1. A light emitting device comprising:
   a light emitting layer having a first side and a second side opposite to the first side;
   a first electrode;
   a current diffusion layer provided between the light emitting layer and the first electrode and including a first layer on the first side of the light emitting layer and a second layer on a side of the first electrode, the second layer having a carrier concentration higher than a concentration of the first layer, a recess being formed in a non-forming region of the first electrode of the current diffusion layer so that a width of the recess decreases toward the light emitting layer, a sidewall of the second layer being at least a part of a sidewall of the recess; and
   a reflecting layer provided on the second side of the light emitting layer,
   the first electrode being provided on the second layer, and
   the light emitting layer and the current diffusion layer being made of a III-V group compound semiconductor, respectively.

2. The device according to claim 1, further comprising:
   a dielectric filled in the recess and having a lower refractive index with respect to the light emitted from the light emitting layer than the current diffusion layer and a higher translucency than the current diffusion layer.

3. The device according to claim 1, wherein a depth of the recess is smaller than a thickness of current diffusion layer.

4. The device according to claim 1, further comprising:
   a contact layer provided between the current diffusion layer and the first electrode.

* * * * *